(12) United States Patent
Chakravarty

(10) Patent No.: US 8,793,549 B2
(45) Date of Patent: Jul. 29, 2014

(54) LOW-COST DESIGN FOR REGISTER FILE TESTABILITY

(75) Inventor: Sreejit Chakravarty, Mountain View, CA (US)

(73) Assignee: LSI Corporation, Milpitas, CA (US)

( * ) Notice: Subject to any disclaimer, the term of this patent is extended or adjusted under 35 U.S.C. 154(b) by 570 days.

(21) Appl. No.: 12/854,682

(22) Filed: Aug. 11, 2010

(65) Prior Publication Data

US 2012/0042220 A1   Feb. 16, 2012

(51) Int. Cl.
*G06F 11/00* (2006.01)
*G11C 29/16* (2006.01)

(52) U.S. Cl.
CPC .......... *G11C 29/16* (2013.01); *G11C 2207/007* (2013.01)
USPC ........................................................ 714/742

(58) Field of Classification Search
CPC ............... G01R 31/318555; G01R 31/318558; G01R 31/318563; G01R 31/318566; G01R 31/318572; G01R 31/31704; G01R 31/31917; G01R 31/31726; G01R 31/3004; G01R 31/318525; G01R 31/318541; G01R 31/318547; H03K 19/0005; H03K 5/135
USPC ........................................................ 714/742
See application file for complete search history.

(56) References Cited

U.S. PATENT DOCUMENTS

| | | | |
|---|---|---|---|
| 6,425,097 B1 * | 7/2002 | Elachkar et al. | 714/43 |
| 6,557,129 B1 * | 4/2003 | Rajski et al. | 714/729 |
| 7,243,283 B2 * | 7/2007 | Onodera | 714/733 |
| 7,487,419 B2 * | 2/2009 | Mukherjee et al. | 714/729 |
| 8,228,750 B2 * | 7/2012 | Chakravarty | 365/201 |
| 2003/0005381 A1 * | 1/2003 | Bristow et al. | 714/738 |
| 2008/0159042 A1 * | 7/2008 | Bertin et al. | 365/225.7 |
| 2009/0138772 A1 * | 5/2009 | Bertacco et al. | 714/733 |

* cited by examiner

*Primary Examiner* — Bryce Bonzo
*Assistant Examiner* — Elmira Mehrmanesh

(57) ABSTRACT

A self-test module for use in an electronic device includes a test controller and a memory. The memory is configured to receive test vectors from the test controller. A comparator is configured to receive the test data from the memory via an output data path. A strobing buffer is located in the output data path between an output from the memory and an input to the comparator. The strobing buffer is configured to selectively enable the test vectors to propagate from the memory output to the comparator input.

20 Claims, 7 Drawing Sheets

LOW-COST DESIGN FOR REGISTER FILE TESTABILITY

TECHNICAL FIELD

This application is directed, in general, to an electronic device, and, more specifically, to self-testing thereof.

BACKGROUND

Electronic devices such as integrated circuits sometimes include self-test circuitry that may be used to determine device functionality before or after deployment of the device in a product. Such circuitry adds significantly to the area needed to implement the device, for example on a semiconductor substrate of an integrated circuit, increasing the cost of manufacturing the device. The added cost of test circuitry sometimes makes it necessary for a manufacturer of the electronic device to forgo additional test circuitry that has the potential to identify defective parts before shipment to a customer.

SUMMARY

One aspect provides a self-test module for use in an electronic device. The self-test module includes a test controller and a memory. The memory is configured to receive test vectors form the test controller. A comparator is configured to receive the test vectors from the memory via an output data path. A strobing buffer is located in the output data path between an output from the memory and an input to the comparator. The strobing buffer is configured to selectively enable the test vectors to propagate from the memory output to the comparator input.

Another aspect provides a method of manufacturing an electronic circuit. The method includes providing a test controller and a memory. The memory is configured to receive test data from the test controller and to output the test data at a memory output. A strobing buffer is located in an output data path between the memory and a comparator. The strobing buffer is configured to selectively enable the test data to propagate from the memory output to the comparator.

Yet another aspect provides an integrated circuit that includes a semiconductor substrate. Test circuitry, and functional circuitry including a memory, are located on the semiconductor substrate. The test circuitry is configured to test the memory, and includes a test controller, and a comparator. The test controller is configured to write test data to the memory. The comparator is configured to receive the test data from the memory via an output data path. A strobing buffer is located in the output data path between the memory output and the comparator. The strobing buffer is configured to selectively enable the test data to propagate from the memory to the comparator.

BRIEF DESCRIPTION

Reference is now made to the following descriptions taken in conjunction with the accompanying drawings, in which.

DETAILED DESCRIPTION

This disclosure contributes the heretofore unrecognized benefit of placing a small, simple strobing buffer in one or more data paths of a built-in self-test (BIST) architecture of an electronic device, e.g., an integrated circuit. Various embodiments presented herein and otherwise within the scope of the disclosure provide the ability to test some memory circuits of the electronic device at a desired operating frequency, advantageously reducing false negatives, e.g., cases in which an electronic device that would not pass a self-test at the desired operating frequency nevertheless passes the self-test at a lower frequency. Such false negatives may undesirably add to the defective parts per million (DPPM) of electronic devices delivered by a manufacturer to a purchaser of the devices.

Figure 1:
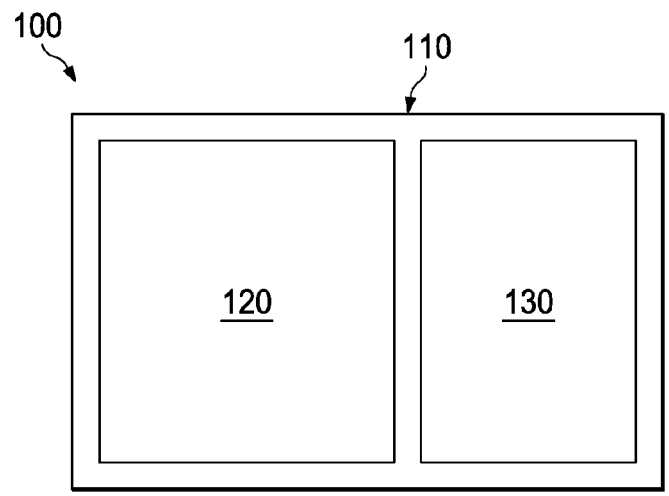
FIG. 1 illustrates an electronic device of the disclosure, including a logic block and a self-test block.

Turning initially to FIG. 1, illustrated is an electronic device 100. The electronic device 100 is illustrated including a semiconductor die 110, and may be an integrated circuit (IC). While embodiments of the disclosure may be particularly advantageous in the context of IC manufacturing and test, such embodiments are not limited to integrated circuits. Upon the die 110 are formed a logic block 120 and a self-test block 130. The blocks 120, 130 are illustrated as contiguous blocks on the die 110 to provide scale of the portions relative to the total area of the die 110 consumed thereby. In practice, however, elements of the self-test block 130 are often interspersed with elements of the logic block 120 as necessary to meet overall design performance objectives. The self-test block 130 increases the size of the die 110, often consuming 10-20% of the available area of the die 110, thereby increasing the cost of the die 110. Thus, there is a significant financial barrier to adding additional self-test circuitry.

Figure 2:
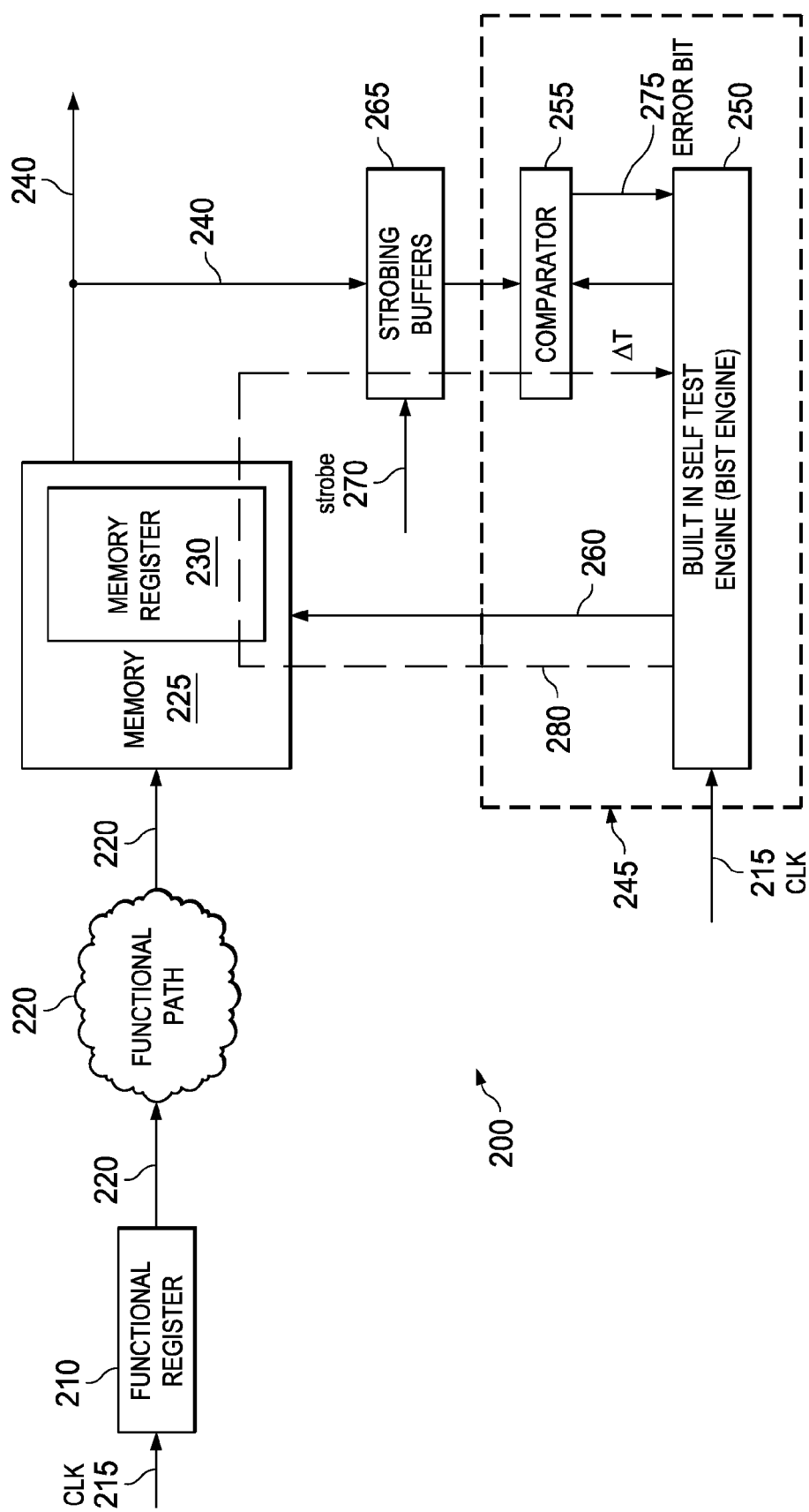
FIG. 2 illustrates an embodiment of a self-test block configured to test a memory.

FIG. 2 illustrates an embodiment generally designated 200 of a self-test architecture in accordance with the disclosure. In the course of operation of the device 100, a functional register 210 clocked by a system CLK 215 provides data via a functional path 220 to an input of a memory 225. The functional register 210 and the functional path 220 may be conventional. The functional register 210 is representative of the numerous ways in which functional circuitry of the device 100 may provide data to the memory 225. The functional path 220 may include, e.g., one or more of metal interconnects, logic gates, and discrete circuit elements (e.g., resistors and capacitors) as needed to implement the design of the device 100.

The memory 225, which may be conventional, includes a memory register 230, e.g. persistent storage of digital data, and supporting circuitry such as address decoders, multiplexers, and discrete logic elements (not shown). The memory 225 may be a core memory of in integrated circuit, meaning the memory 225 is part of the physical layout of the integrated circuit, and not external thereto. In the course of conventional operation, the memory 225 may be used by the device 100 to store data, and later to provide the data from an output of the memory 225 via an output data path 240. The output data path 240 may include a plurality of bit paths, with one bit path corresponding to each bit of the output of the memory 225.

A test controller 245 includes a built-in self-test (BIST) engine 250 and a comparator 255. The test controller 245 is configured to write test vectors via a test vector path 260 to the memory 225. As used herein, a test vector is a combination of bits configured to test an aspect of operation of the memory 225. The test vectors may be conventionally routed to the memory 225 via a multiplexer and supporting control circuitry. The comparator 255 is configured to receive the test vectors from the output data path 240 via strobing buffers 265, discussed in detail below. The strobing buffers 265 are clocked by a strobe 270. The BIST engine 250 is further configured to provide response vectors to the comparator 255. The response vectors may be, e.g., data that the BIST engine has been configured to expect from the memory 225 in response to the test vectors provided by the BIST engine 250 to the memory 225. In some cases a response vector may be equal to a corresponding test vector, but need not be. The comparator 255 is conventionally configured to provide an error bit 275 to the BIST engine 250 in the event that the data output by the memory 225 does not match the expected value, e.g. the response vector, corresponding to that output data. The BIST engine 250 may be configured to conventionally perform an action in the event that the output data and the response vector do not match. For example, the action may include generating an alert signal.

A latency (propagation time) path 280 describes a circuit path that results in a response delay ΔT from the instant in time the BIST engine 250 provides a particular test vector to the memory 225 to the instant in time at which the comparator 255 provides the error bit 275 corresponding to that test vector to the BIST engine 250. It is sometimes the case that ΔT is greater than a period of the CLK 215 when the CLK 215 is operated at a desired operating frequency. For example, without limitation, the device 100 may be configured to operate at a CLK 215 design frequency of 1 GHz when deployed in a product. In this case the CLK 215 has a period of about 1 ns. However, the response delay ΔT may be greater than 1 ns, e.g. 1.2 ns. In this example, the test controller 245 may be configured to test the memory 225 at a reduced test frequency, e.g., 800 MHz, to account for the response delay ΔT. In most cases, testing at this reduced frequency is adequate to determine the functionality of the memory 225 when operated at 1 GHz.

However, for a small but significant fraction of a large number of devices 100 tested at the reduced frequency, an error that would otherwise occur at the design frequency, e.g. 1 GHz, fails to occur. In such a case, the device 100 may fail in a customer installation even though it passed outgoing functional tests. Such failures are clearly undesirable to the customer and manufacturer alike. A maximum defect rate of all post-delivery device 100 failures is typically capped by agreement between the manufacturer and the customer to a negotiated DPPM value. The maximum allowable DPPM includes failures of all types, so failures attributable to a marginal memory 225 reduce the number of allowable failures from all other sources.

In some conventional cases, a manufacturer of the device 100 might consider conventionally pipelining the path between the output data path 240 and the comparator 255. A conventional pipeline is typically implemented with a bank of strobing flip-flops. Those of skill in the pertinent art understand that a strobing flip-flop persistently stores a data value presented at its input by latching the data in a bistable circuit.

However, the output data path 240 may be wide, e.g., 72 bits or more. For example, the memory 225 may include register memory, which is typically wide and shallow, e.g., 128 80-bit words. In such cases, pipelining the output data path 240 may be prohibitively expensive, as each strobing flip-flop of a pipeline register may use 35 or more transistors. As described previously, self-test circuitry on a conventional integrated circuit device may already consume 10-20% of the circuit area. Thus, the area needed to implement pipeline registers may be unavailable.

Embodiments of the disclosure provide a heretofore unrecognized means to test the memory 225 at the design frequency of the device 100. As described below, the strobing buffers 265 consume a small fraction of the area that would be consumed by pipeline registers using strobing flip-flops, and thus provide a means to increase the frequency at which the memory 225 is tested without significantly increasing the area consumed by the self-test block 130.

Figure 3:
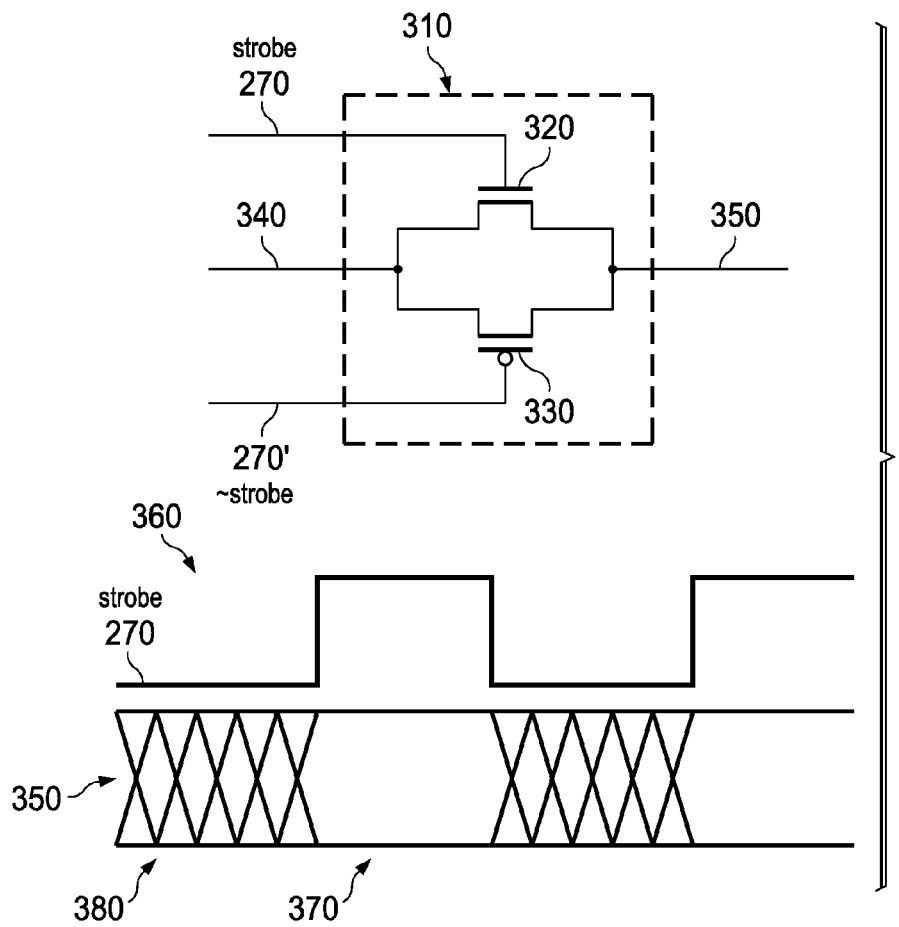
FIG. 3 illustrates a strobing buffer cell configurable to selectively enable test data to propagate from the memory of FIG. 2 to a comparator.

Turning to FIG. 3, a strobing buffer cell 310 is illustrated. The strobing buffers 265 may include a plurality of the buffer cells 310. Each bit path of the output data path 240 may include one or more buffer cells 310. The buffer cell 310 is illustrated including two transistors. A first transistor 320 is enabled by a positive polarity of the strobe 270. A second transistor 330 is enabled by a negative polarity of the strobe 270, designated ~strobe 270'. Thus each bit path of the output data path 240 may be controlled by no more than two transistors. In the illustrated embodiment, the transistors 320, 330 are shown as FET transistors, but other embodiments may use another transistor type, e.g., bipolar transistors.

When the transistors 320, 330 are enabled, e.g., by a high state of the strobe 270 and a low state of the ~strobe 270', respectively, the impedance between an input 340 and an output 350 of the buffer cell 310 is low so a signal applied to the input 340 is conducted to the output 350. This case is illustrated by a timing diagram 360, in which a state 370 indicates that data at the output 350 is valid. Conversely, if the transistors 320, 330 are disabled, then the impedance between the input 340 and the output 350 is high, and data applied to the input 340 is conductively isolated from the output 350. This case is illustrated by the timing diagram 360, in which a state 380 indicates that data at the output 350 is indeterminate.

While in some cases the use of two complementary transistors such as the transistors 320, 330 advantageously results in balanced signal levels, embodiments using only a single transistor in the buffer cell 310 are within the scope of the disclosure. For example, either one of the first transistor 320 and the second transistor 330 may be used, with the appropriate phase of the strobe 270.

Figure 4:
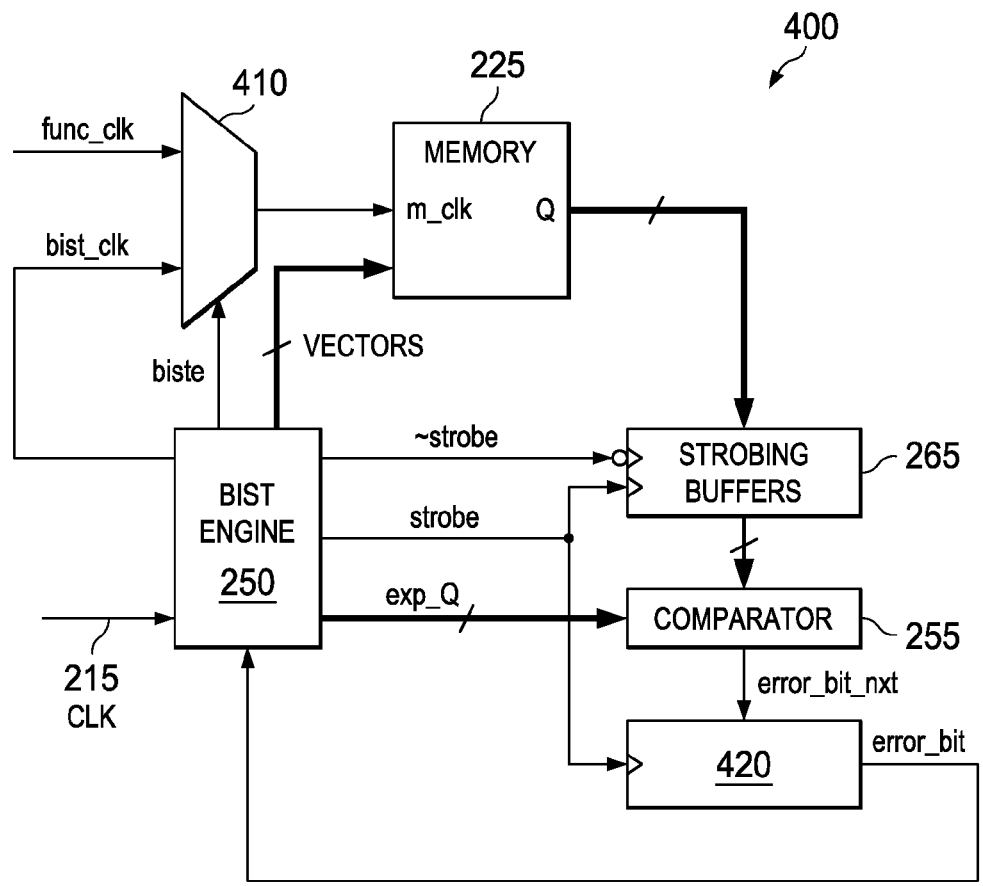
FIG. 4 illustrates an embodiment of the self-test architecture of FIG. 2 in a manner that features timing relationships among the elements of the architecture.

Turning to FIG. 4, an embodiment generally designated 400 is illustrated in a manner that features timing relationships among the elements thereof. The BIST engine 250 is clocked by the system clock CLK 215. A multiplexer 410 under control by a biste signal generated by the BIST engine 250 selects between a functional clock func_clk and a self-test clock bist_clk. The output of the multiplexer 410 clocks the memory 225. Data Q appears at the output of the memory 225 after a short read delay. The strobing buffers 265 may be placed at a position in the data path between the memory 225 and the strobing buffers 265 to which the data signals propagate in less than one period of the CLK 215. For example, if it is desired to test the memory 225 at a rate of 1 GHz and the data signals output by the memory 225 propagate 1 mm in 1 ns, including all interconnect and gate delays, then the strobing buffers 265 may be placed in the data path less than 1 mm (of the signal path) from the memory 225.

Figure 5:
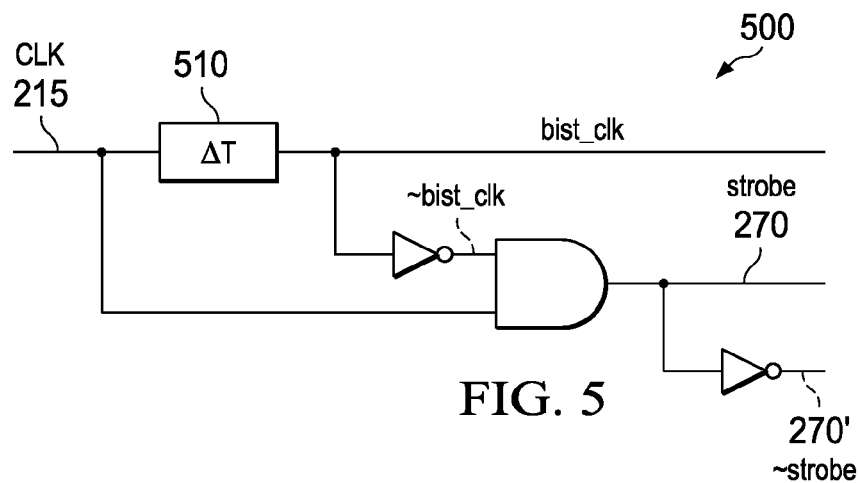
FIG. 5 illustrates an example circuit configured to generate strobe and ~strobe signals employed in the embodiment of FIG. 4.

The BIST engine 250 generates strobe and ~strobe signals that are coupled to the strobing buffers 265. Turning briefly to FIG. 5, illustrated is an example circuit 500 configured to generate a suitable strobe 270 and ~strobe 270' signal. Generally, the strobe signal is active coincident with the rising edge of the CLK 215 signal, and for the duration of a time delay $\Delta T$ of a delay element 510.

Returning to FIG. 4, during self test the BIST engine 250 provides test vectors to the memory 225. Data Q from the memory 225 and a response vector (e.g., expected data exp_Q) are then presented to the comparator 255. The comparator 255 generates an error_bit_nxt output representing the outcome of the comparison of Q and exp_Q. For example, without limitation, a high value of error_bit_nxt may represent the condition that Q and exp_Q are identical, while a low value of error_bit_nxt may represent the condition that Q and exp_Q are different. The error_bit_nxt output is latched into a latch 420, the output of which is provided to the BIST engine 250 for appropriate action.

Figure 6:
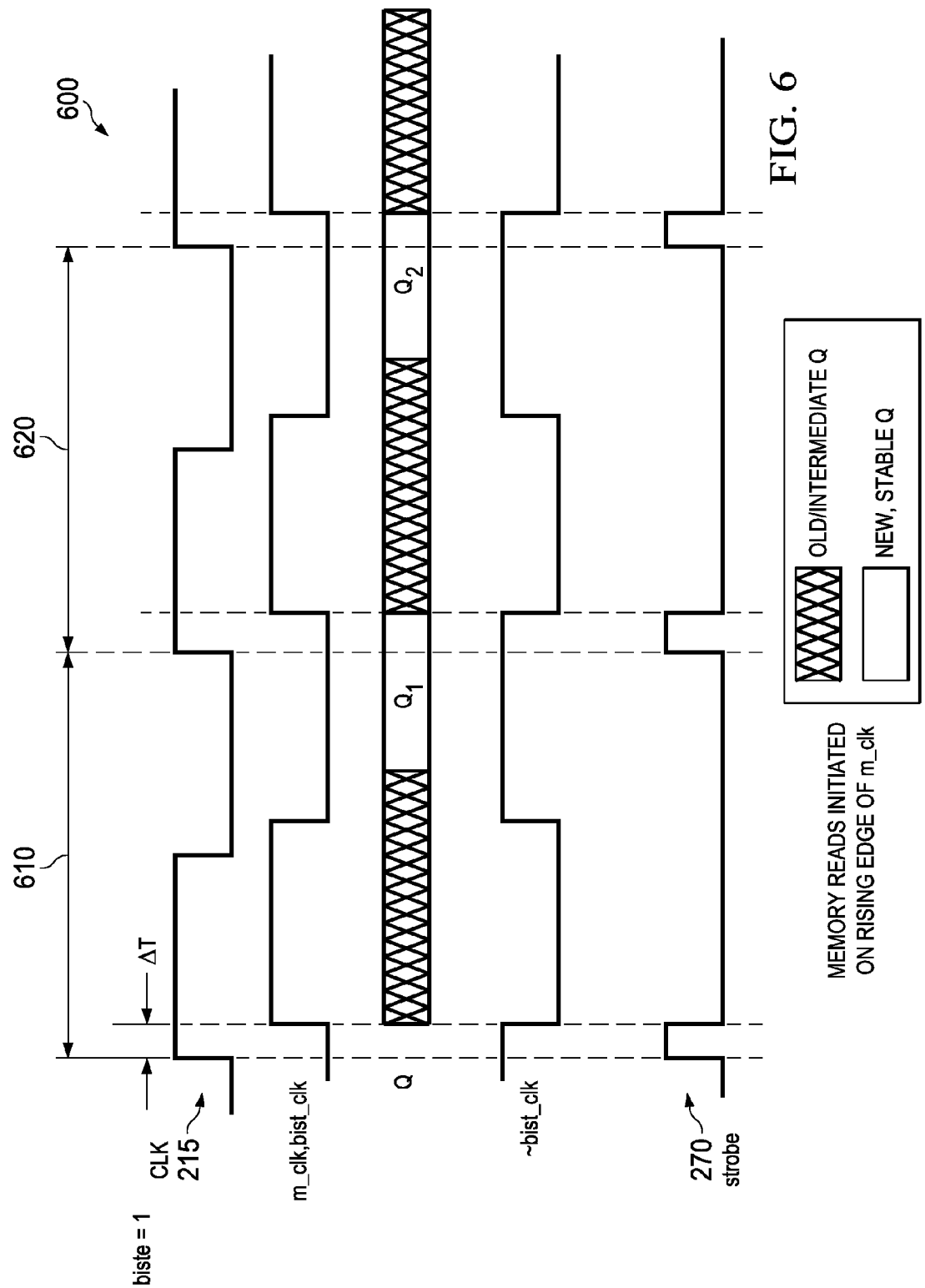
FIG. 6 is a timing diagram that illustrates example timing relationships between the elements of FIG. 4.

FIG. 6 is a timing diagram 600 that illustrates the timing relationships between the elements of FIG. 4. Two periods 610, 620 of the CLK 215 are illustrated. The illustrated timing is presented for the case that biste=1. Thus, the multiplexer 410 selects the bist_clk signal for output to the memory 225. The bist_clk lags the CLK 215 by $\Delta T$ (see FIG. 5), producing the strobe 270 at the beginning of each period 610, 620. During the period 610, the BIST engine 250 causes the memory 225 to output data $Q_1$. The $Q_1$ data becomes valid during the latter half of the period 610. While the $Q_1$ is active, the strobe 270 (and ~strobe 270', if used) causes the strobing buffers 265 to be in a low-impedance state, allowing the $Q_1$ data to propagate to the inputs of the comparator 255. During the period 620, the comparator 255 determines if the $Q_1$ data is equal to corresponding exp_Q data, and forms the error_bit_nxt output. The strobe 270 then latches the value of the error_bit_nxt into the latch 420.

The illustrated embodiment demonstrates that one error_bit may be generated during each clock cycle of the CLK 215. Thus, the strobing buffers 265 act to create a quasi-pipeline in the data path between the memory 225 and the comparator 255. The presence of the strobing buffers 265 enables the bist_clk to run at the same frequency as the func_clk, thereby providing for testing the memory 225 at the same speed that the memory 225 operates during normal operation. As described previously, this advantageously provides that marginal devices 100 that might otherwise fail after delivery to a customer are detected and discarded prior to delivery.

Figure 7:
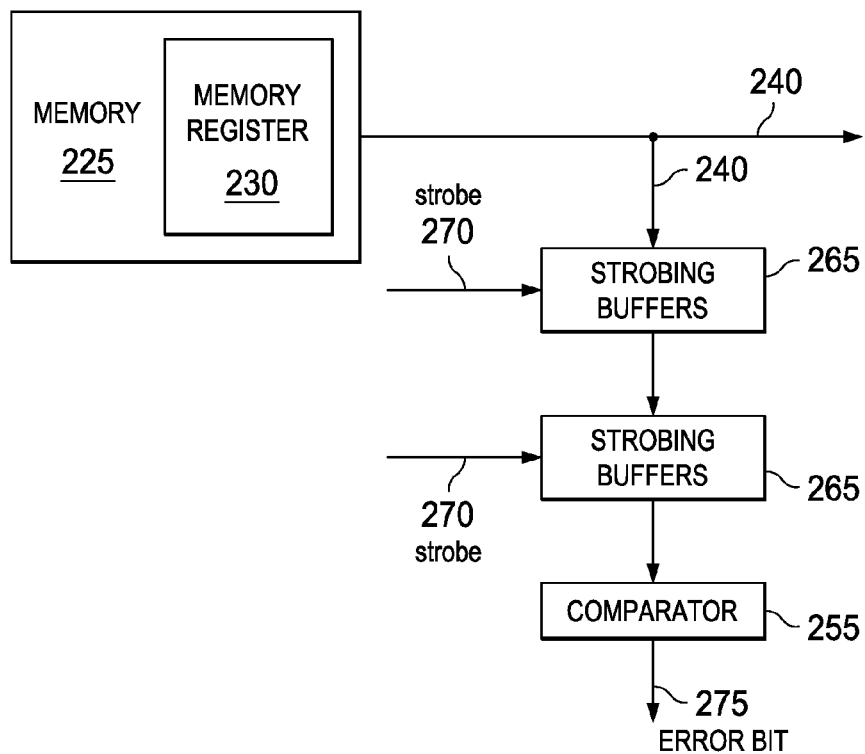
FIG. 7 illustrates an embodiment in which a plurality of strobing buffers are located between a data output of a memory and a comparator input.

FIG. 7 illustrates an embodiment in which a plurality of strobing buffers 265 are located between the data output of the memory 225 and the input of the comparator 255. In a case in which the latency from the data output of the memory 225 and the input of the comparator 255 exceeds a single period of the CLK 215, two strobing buffers 265 may be configured serially in the data path to extend the quasi-pipeline of the memory data. Those skilled in the pertinent art will appreciate that the principle may be extended beyond two strobing buffers 265.

As described previously, use of the strobing buffers 265 consumes significantly less area of the substrate upon with the device 100 is formed than would a similar flip-flop register as might be used in a conventional pipeline. A nonlimiting example presented in TABLE 1 compares the areas in $\mu m^2$ needed to implement two embodiments of the disclosure to the areas needed to implement a conventional pipeline using strobing flip-flops. In a first set, the memory 225 is taken to be a 128×72 single port register memory having an area of 8713 $\mu m^2$. In a second set, the memory 225 is taken to be a 512×24 dual-port register memory having an area of 9595 $\mu m^2$. The area of the strobing buffer 265 is computed for a strobing buffer cell 310 having an area of 0.972 $\mu m^2$. FF1, FF2 and FF3 refer to three different standard flip-flop cells taken from a commercially available CAD tool. The cell areas of FF1, FF2 and FF3 are 6.804 $\mu m^2$, 7.776 $\mu m^2$, and 10.044 $\mu m^2$, respectively. The percentage reduction of total area for each memory combined with strobing buffers versus each memory combined with a pipeline register based on each flip-flip type is presented.

The results of Table 1 demonstrate that for the illustrated examples the area needed to implement embodiments of the disclosure, relative to a conventional pipeline implementation, result in a reduction of needed substrate area between about 2.9% and about 7.5%. Such a reduction of needed area in the context of semiconductor device manufacturing is significant, and in many cases makes it economically feasible to place the strobing buffers 265 in the self-test block 130, where it would not be feasible to place a similar solution using strobing flip-flops.

TABLE 1

| Strobing Buffer Type | Area | | | | | % Improvement, strobing buffer relative to strobing FF | | |
|---|---|---|---|---|---|---|---|---|
| | Strobing Buffer ($\mu m^2$) | Strobing FF | | | Memory ($\mu m^2$) | | | |
| | | FF1 ($\mu m^2$) | FF2 ($\mu m^2$) | FF3 ($\mu m^2$) | | FF1 | FF2 | FF3 |
| 128X72, 1P | 69.984 | 489.888 | 559.872 | 723.168 | 8713 | 4.82 | 5.62 | 7.5 |
| 512X24, 2P | 46.656 | 326.592 | 373.248 | 482.112 | 9595 | 2.92 | 3.40 | 4.54 |

Figure 8:
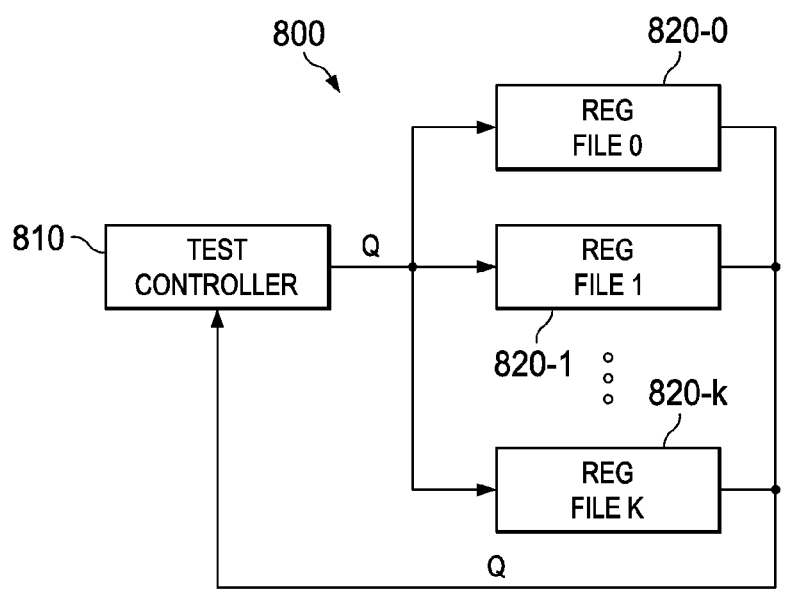
FIG. 8 illustrates an embodiment in which a test controller is shared among a plurality of register files.

Turning to FIG. 8, illustrated is an embodiment generally designated 800 of a self-test architecture in which a test controller 810 is configured to provide test vectors to a plurality of memories 820-0, 820-1, . . . 820-k. The memories 820-0, 820-1, . . . 820-k are illustrated without limitation as register files, and are collectively referred to as register files 820. Such architecture may be used in some cases to reduce die area consumed by self-test circuitry. In some cases controller sharing may result in the test controller 810 being located remote from at least one of the register files 820. Herein, remote with respect to placement of two components in electrical communication means relative placement of the components such that latency of signals between the components is greater than one period of a clock signal, e.g. the CLK 215, synchronizing operation of the components. When the test controller 810 is located remote from a register file 820 this latency may result in a significant reduction of the frequency at which the test controller 245 may conventionally exercise the distant register file 820.

Figure 9:
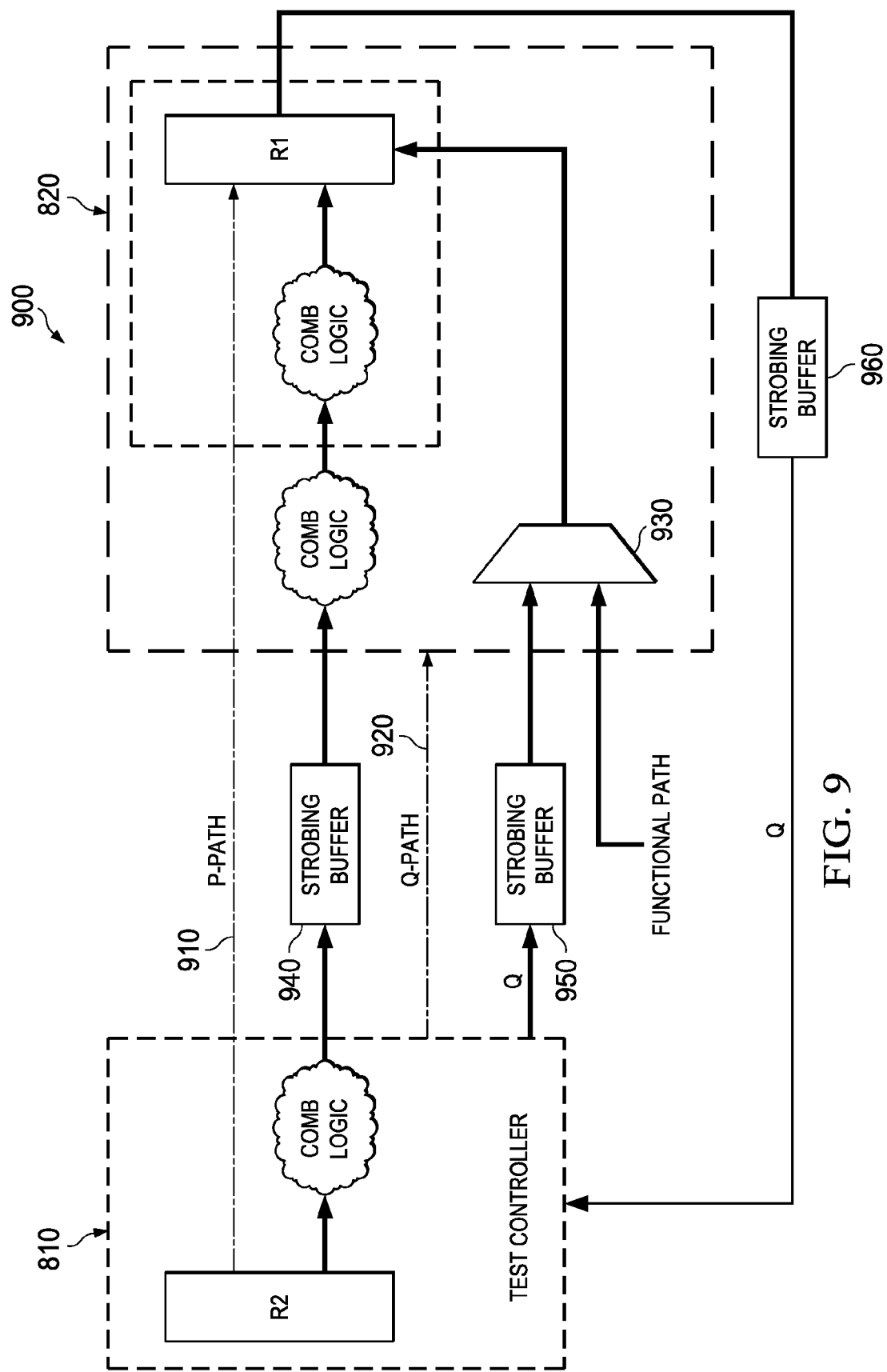
FIG. 9 illustrates a an embodiment in which a strobing buffer is located in a signal path between a test controller and a memory.

FIG. 9 illustrates an embodiment generally designated 900 in which one or more strobing buffers is located between the test controller 810 and one of the register files 820-0, 820-1, ..., 820-k, here represented generally by a register file 820. Two data paths are shown. A logic data path 910 propagates control signals (P) from the test controller 810 to the register file 820. A test vector (Q) data path 920 propagates test vectors from the test controller 810 to the register file 820. A multiplexer 930 selects between functional data associated with normal operation of the device 100, and test vectors Q associated with a self-test mode.

A strobing buffer 940 is located in the logic data path 910 and a strobing buffer 950 is located in the test vector data path 920. The strobing buffer 940 may be placed in the logic data path 910 at a position at which the distance signals from a component at one end of the logic data path 910, e.g., a register R2 within the test controller 810, propagate in less than a full period of a system clock, e.g., the CLK 215. Similarly, the strobing buffer 950 may be placed in the test vector data path 920 at a position at which the distance signals from a test vector source within the test controller 810 propagate in less than the full period of the system clock. A strobing buffer 960 may be placed in a data path between the output of the register file 820 and the test controller 810 as previously described.

Figure 10A:
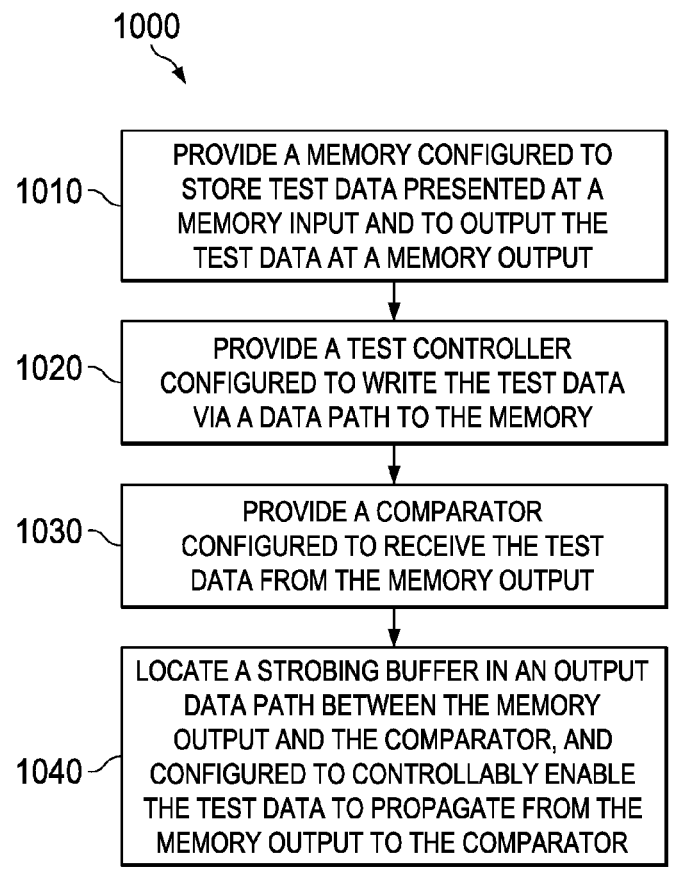
FIGS. 10A and 10B present a method of manufacturing an integrated circuit device, such as the electronic device of FIG. 1.
Figure 10B:
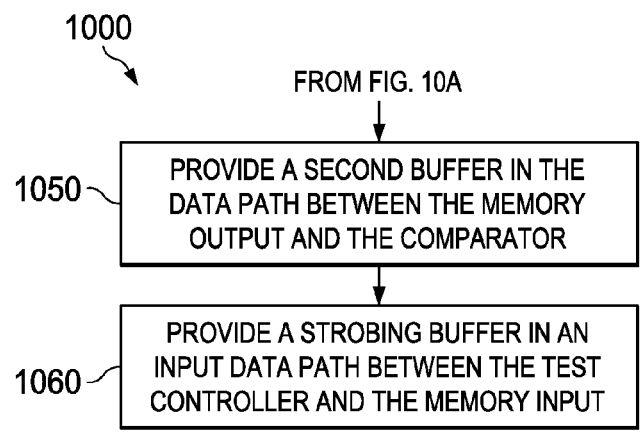

Turning finally to FIGS. 10A and 10B, illustrated is a method 1000 of the disclosure. The steps of the method 1000 may be performed in another order than the illustrated order. Focusing initially on FIG. 10A, the method 1000 begins with a step 1010, in which a memory is provided. Herein and in the claims, "provided" means that a device, substrate, component, structural element, etc., may be manufactured by the individual or business entity performing the disclosed methods, or may be obtained thereby from a source other than the individual or business entity, including another individual or business entity. The memory has an input and an output. The memory is configured to store test data presented at the input, and to provide the test data at the output.

In a step 1020, a test controller is provided. The test controller is configured to write the test data via a data path to the memory. In a step 1030, a comparator is provided. The comparator is configured to receive the test data from the memory output.

In a step 1040, a strobing buffer is provided. The strobing buffer is located in an output data path between the memory output and the comparator. The strobing buffer is configured to selectively enable the test data to propagate from the memory output to the comparator.

In FIG. 10B, various optional steps are illustrated that may be performed in the method 1000. In a step 1050, a second buffer is provided in the data path between the memory output and the comparator. In a step 1060, a strobing buffer is provided in an input data path between the test controller and the memory input.

Those skilled in the art to which this application relates will appreciate that other and further additions, deletions, substitutions and modifications may be made to the described embodiments.

What is claimed is:

1. A self-test module for use in an electronic device, comprising:
    a test controller;
    a memory configured to receive test vectors from said test controller;
    a comparator configured to receive said test vectors from said memory via an output data path;
    a strobing buffer located in said output data path between an output from said memory and an input to said comparator, and configured to selectively enable each of said test vectors to propagate from said memory output to said comparator input, wherein said strobing buffer enables said propagation using no more than two transistors.

2. The self-test module as recited in claim 1, wherein said output data path comprises a plurality of bit paths.

3. The self-test module as recited in claim 1, wherein said test controller is configured to write test vectors to a plurality of memories.

4. The self-test module as recited in claim 1, wherein a latency from said memory output to an output of said comparator is greater than one period of a rate that said test data is written to said memory.

5. The self-test module as recited in claim 1, wherein said memory is a register file at least 72 bits wide.

6. The self-test module as recited in claim 1, wherein said strobing buffer is a first strobing buffer, and further comprising a second strobing buffer located in said test data path.

7. The self-test module as recited in claim 1, wherein said strobing buffer is a first strobing buffer, and further comprising a second strobing buffer located in a logic path between said test controller and said memory.

8. A method of manufacturing an electronic device, comprising:
    providing a test controller configured to output test data;
    providing a memory configured to receive said test data and to output said test data at a memory output;
    locating a strobing buffer in an output data path between said memory output and a comparator, said strobing buffer configured to selectively enable each of said test data to propagate from said memory output to said comparator, wherein said strobing buffer enables said propagation using no more than two transistors.

9. The method as recited in claim 8, wherein said output data path comprises a plurality of bit paths.

10. The method as recited in claim 8, wherein said test controller is configured to write test vectors to a plurality of memories.

11. The method as recited in claim 8, wherein a latency from said memory output to an output of said comparator is greater than one period of a rate that said test data is written to said memory.

12. The method as recited in claim 8, wherein said memory is a register file having a width of at least 72 bits.

13. The method as recited in claim 8, wherein said strobing buffer is a first strobing buffer, and further comprising providing a second strobing buffer located in said test data path.

14. The method as recited in claim 8, wherein said strobing buffer is a first strobing buffer, and further comprising providing a second strobing buffer located in said test data path between said test controller and said memory input.

15. An integrated circuit, comprising:
    a semiconductor substrate;
    functional circuitry located on said semiconductor substrate, including a memory;

test circuitry located on said semiconductor substrate, and configured to test said memory, including:
- a test controller configured to write test data to said memory;
- a comparator configured to receive said test data from said memory via an output data path; and
- a strobing buffer located in said output data path between said memory and said comparator and configured to selectively enable each of said test data to propagate from said memory to said comparator, wherein said strobing buffer enables said propagation using no more than two transistors.

16. The integrated circuit of claim 15, wherein said output data path comprises a plurality of bit paths.

17. The integrated circuit as recited in claim 15, wherein a latency from said memory output to an output of said comparator is greater than one period of a frequency at which said test data is written to said memory.

18. The integrated circuit as recited in claim 15, wherein said memory is a register file at least 72 bits wide.

19. The integrated circuit as recited in claim 15, wherein said strobing buffer is a first strobing buffer, and further comprising a second strobing buffer located in said test data path.

20. The integrated circuit as recited in claim 15, wherein said strobing buffer is a first strobing buffer, and further comprising a second strobing buffer located in a logic path between said test controller and said memory.

* * * * *